(12) United States Patent  
Ranganathan et al.

(10) Patent No.: US 7,906,955 B2
(45) Date of Patent: Mar. 15, 2011

(54) ON-CHIP CURRENT SENSING METHODS AND SYSTEMS

(75) Inventors: Sumant Ranganathan, Sunnyvale, CA (US); Zhou Lin, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/382,286

(22) Filed: Mar. 12, 2009

(65) Prior Publication Data

US 2009/0179629 A1     Jul. 16, 2009

Related U.S. Application Data

(63) Continuation of application No. 11/707,023, filed on Feb. 16, 2007, now Pat. No. 7,508,188.

(60) Provisional application No. 60/809,393, filed on May 31, 2006.

(51) Int. Cl.
  *G01R 15/18*     (2006.01)

(52) U.S. Cl. .................................................... 324/117 R

(58) Field of Classification Search ............... 324/117 H, 324/117 R, 126, 763–765
See application file for complete search history.

(56) References Cited

U.S. PATENT DOCUMENTS

| 3,659,199 | A | | 4/1972 | Knutson |
| 4,276,510 | A | * | 6/1981 | Tompkins et al. ............. 324/127 |
| 5,568,054 | A | | 10/1996 | Iino et al. |
| 5,917,331 | A | | 6/1999 | Persons |
| 6,239,990 | B1 | | 5/2001 | Feldtkeller |
| 6,366,076 | B1 | | 4/2002 | Karrer et al. |
| 6,445,171 | B2 | | 9/2002 | Sandquist et al. |
| 6,633,551 | B1 | | 10/2003 | Kent et al. |
| 6,943,576 | B2 | * | 9/2005 | Byun et al. ..................... 324/765 |

* cited by examiner

*Primary Examiner* — Ha Tran T Nguyen
*Assistant Examiner* — Joshua Benitez
(74) *Attorney, Agent, or Firm* — Sterne, Kessler, Goldstein & Fox P.L.L.C.

(57) ABSTRACT

A switch regulator module includes a switch and a current sensing module. The switch has an input port and an output port. The current sensing module senses a first voltage at the input port of the switch and a second voltage at the output port of the switch. The current sensing module generates a sense signal that is proportional to a current that flows through the switch based on the first and second voltages.

18 Claims, 7 Drawing Sheets

ON-CHIP CURRENT SENSING METHODS AND SYSTEMS

CROSS REFERENCED TO RELATED APPLICATIONS

This application is a continuation of U.S. patent application Ser. No. 11/707,023, filed on Feb. 16, 2007, which claims the benefit of U.S. Provisional Patent Application No. 60/809,393, filed May 31, 2006, both of which are incorporated herein by reference in their entirety.

BACKGROUND OF THE INVENTION

1. Field of the Invention

The present invention relates generally to circuitry, and more specifically to circuitry that senses a current.

2. Background

Portable electronic devices are becoming increasingly popular in the marketplace. Such portable devices often include a low power switch regulator, which includes power conversion circuitry and other mixed-signal circuitry. A variety of techniques have been employed to improve the performance of conventional switch regulators. A trend in the industry is to integrate the power conversion circuitry and the other mixed signal circuitry on the same substrate to improve efficiency. Current sensing is another technique that may be used to improve the performance of a switch regulator. For example, an integrated switch-mode converter of the switch regulator may be configured to sense a current of the portable electronic device. Several conventional current sensing techniques are available. However, each of these techniques has problems that may render the respective techniques inadequate and/or undesirable for at least some applications.

Many conventional techniques sense current by incorporating a serial resistor in the path of the current. For instance, a first conventional technique uses an off-chip resistor coupled in series with an inductor to sense the current of the inductor. However, this technique requires the entire current of the inductor to flow through the resistor. For this and other reasons, the first conventional technique is characterized by a relatively high power dissipation. Moreover, additional input/output (I/O) pins and board routing are needed for implementation of this technique.

In a second conventional technique, a resistor is coupled in series with a main power switch. The drain current of the main power switch flows through the resistor, enabling the drain current to be sensed. However, this technique is characterized by relatively low efficiency. For example, the resistor used in the second conventional technique needs to be large enough to provide sufficient swing for further analog signal processing.

What is needed is a system and method that addresses one or more of the aforementioned shortcomings of conventional current sensing techniques.

BRIEF DESCRIPTION OF THE DRAWINGS/FIGURES

The accompanying drawings, which are incorporated herein and form part of the specification, illustrate embodiments of the present invention and, together with the description, further serve to explain the principles of the invention and to enable a person skilled in the pertinent art(s) to make and use the invention.

In the drawings, like reference numbers indicate identical or functionally similar elements. Additionally, the leftmost digit(s) of a reference number identifies the drawing in which the reference number first appears.

DETAILED DESCRIPTION OF THE INVENTION

Although the embodiments of the invention described herein refer specifically, and by way of example, to portable electronic devices and components thereof, including low power switch regulators, it will be readily apparent to persons skilled in the relevant art(s) that the invention is equally applicable to other devices and systems. It will also be readily apparent to persons skilled in the relevant art(s) that the invention is applicable to any apparatus or system requiring switch regulation.

This specification discloses one or more embodiments that incorporate the features of this invention. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the art to effect such feature, structure, or characteristic in connection with other embodiments whether or not explicitly described.

Figure 1:
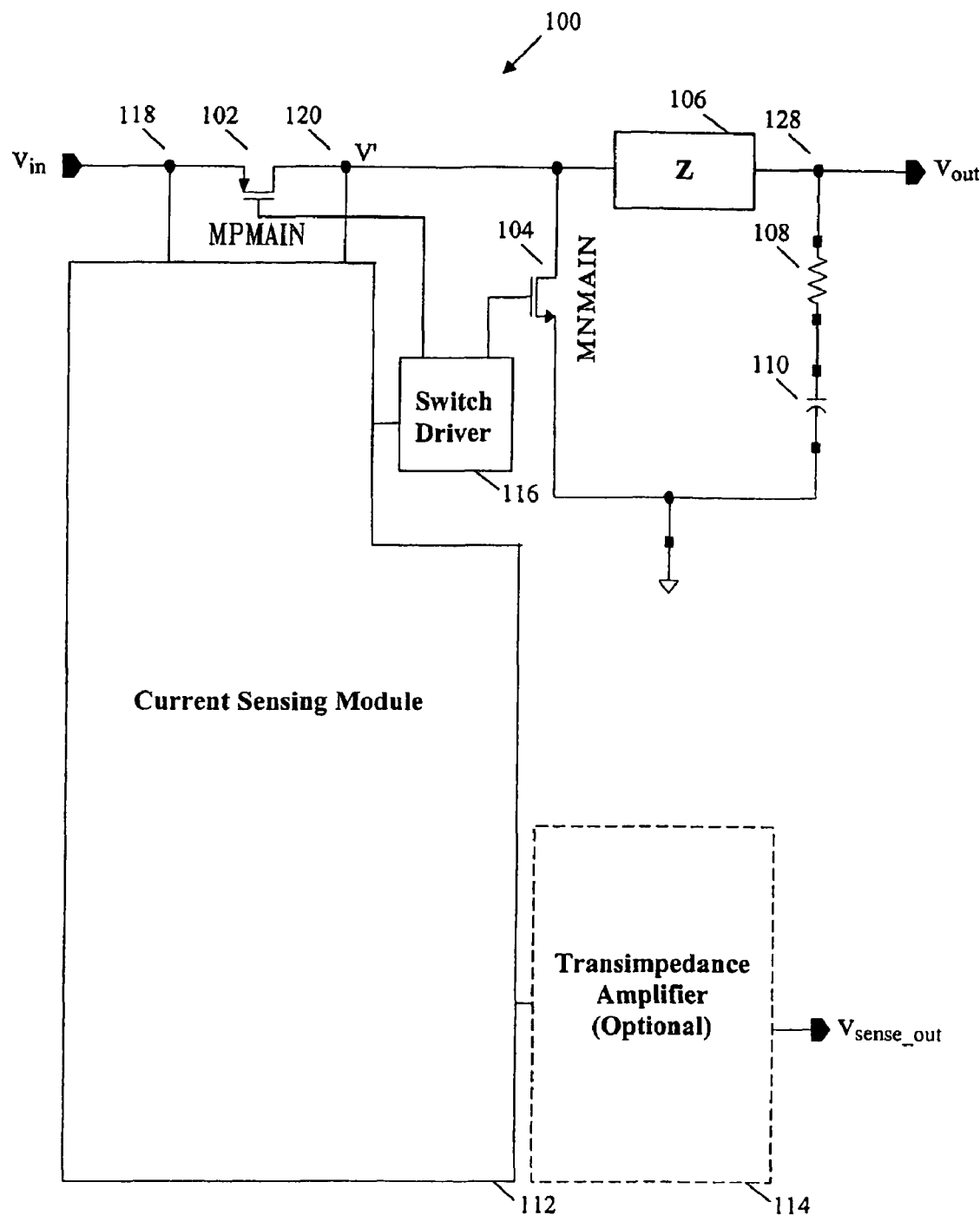
FIG. 1 is a schematic representation of an example switch regulator module, according to an embodiment of the present invention.

FIG. 1 is a schematic representation of an example switch regulator module 100, according to an embodiment of the present invention. Switch regulator module 100 includes a P-type switch 102, an N-type switch 104, an impedance 106, a resistor 108, a capacitor 110, a current sensing module 112, an optional transimpedance amplifier 114, and a switch driver 116. P-type switch 102 and N-type switch 104 are shown as field effect transistors (FETs) for illustrative purposes and are not intended to limit the scope of the present invention. P-type switch 102 and N-type switch 104 may be any type of transistor, including but not limited to high electron mobility transistor (HEMT), bipolar junction transistor (BJT), etc.

In FIG. 1, when P-type switch 102 is "on" and N-type switch 104 is "off", current sensing module 112 senses the voltage dV across the source and drain terminals of P-type switch 102 to determine the current dI that flows through P-type switch 102. Current sensing module 112 provides a sense current $dI_{sense}$ based on the current dI without the need for conventional current sensing techniques. Switch regulator module 100 is shown to include transimpedance amplifier 114 for illustrative purposes, though the scope of the present invention is not limited in this respect. For instance, switch regulator module 100 need not necessarily include transimpedance amplifier 114. Transimpedance amplifier 114 provides a sense voltage $V_{sense\_out}$ based on the sense current $dI_{sense}$ in switch regulator module 100.

Referring to FIG. 1, an input voltage $V_{in}$ is received at node 118, which is coupled to a source of P-type switch 102. A node 120 is coupled to a drain of P-type switch 102. Impedance 106 is coupled between node 120 and an output node 128. N-type switch 104 is coupled between node 120 and a ground potential. Resistor 108 and capacitor 110 are coupled in series between output node 128 and the ground potential. In FIG. 1, resistor 108 is not a physical resistor. Instead, resistor 108 represents the equivalent resistance of capacitor 110.

Switch driver 116 is coupled between a gate of P-type switch 102 and a gate of N-type switch 104 to control the "on" and "off" states of respective switches 102 and 104. Switch driver 116 turns on P-type switch 102 in response to turning off N-type switch 104. Switch driver 116 sets the duty cycle of P-type switch 102 based on the proportion of time that P-type switch 102 is turned on. Switch driver 116 turns on N-type switch 104 in response to turning off P-type switch 102. Switch driver 116 sets the duty cycle of N-type switch 104 based on the proportion of time that N-type switch 104 is turned on. Turning on P-type switch 102 and N-type switch 104 at the same time would cause a shoot-through current, effectively short-circuiting $V_{in}$ to the ground potential. Accordingly, switch driver 116 is configured to ensure that P-type switch 102 and N-type switch 104 are not turned on at the same time.

Current sensing module 112 is coupled to nodes 118 and 120. Current sensing module 112 senses input voltage $V_{in}$ at node 118 and another voltage V' at node 120 and provides sense current $dI_{sense}$ to transimpedance amplifier 114 based on the difference between $V_{in}$ and V'. In FIG. 1, transimpedance amplifier 114 is shown to be external to current sensing module 112 for illustrative purposes. However, persons skilled in the relevant art(s) will recognize that current sensing module 112 can include transimpedance amplifier 114.

Switch regulator module 100 is shown as a buck regulator for illustrative purposes and is not intended to limit the scope of the present invention. Persons skilled in the relevant art(s) will recognize that the present invention is applicable to all types of regulators, including but not limited to boost regulators. It will also be recognized that switch regulator module 100 need not necessarily be a regulator.

Figure 2:
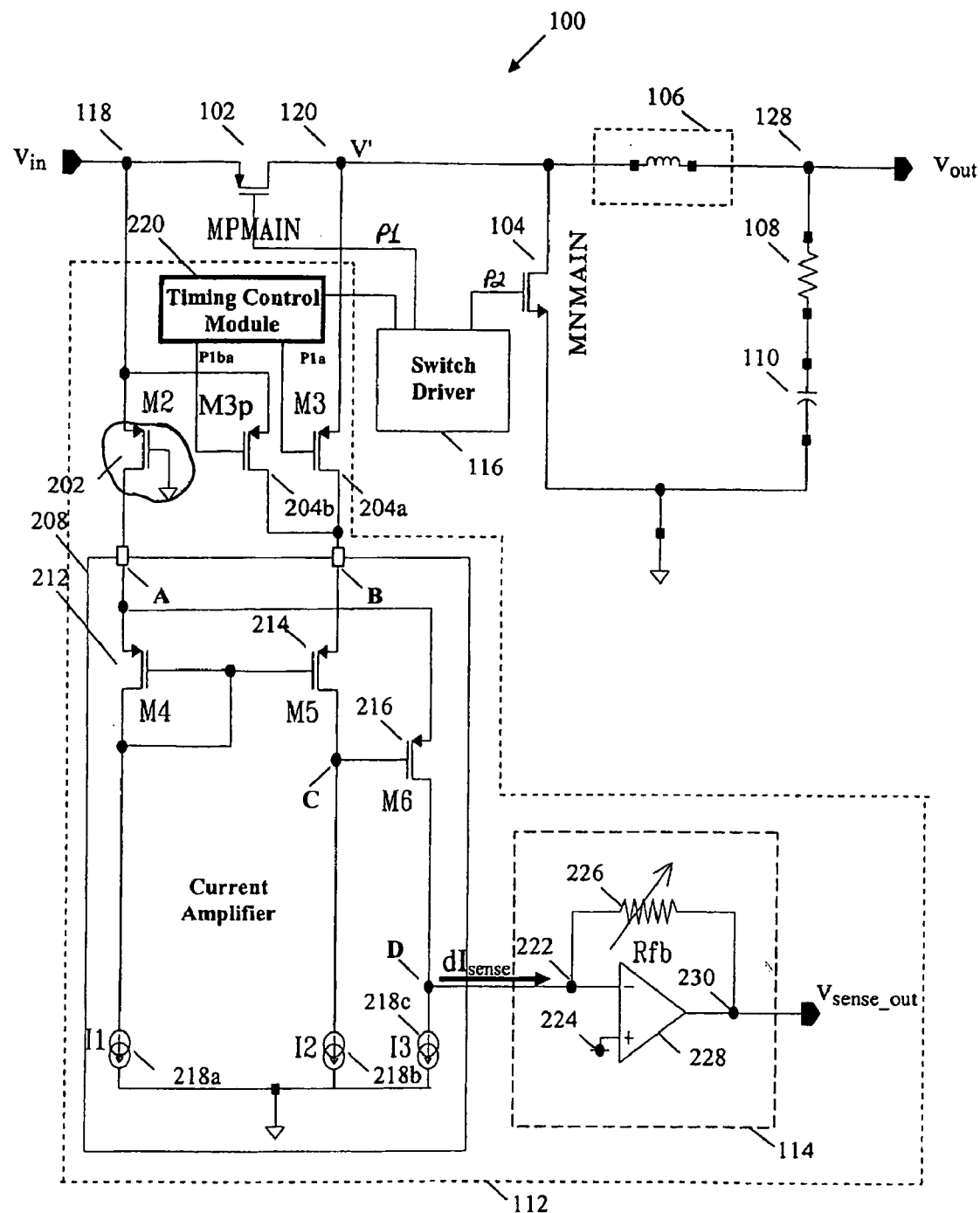
FIG. 2 is an example implementation of the switch regulator module shown in FIG. 1, according to an embodiment of the present invention.

FIG. 2 is an example implementation of switch regulator module 100 shown in FIG. 1, according to an embodiment of the present invention. In FIG. 2, current sensing module 112 is shown to include transimpedance amplifier 114 for illustrative purposes. Current sensing module 112 further includes timing control module 220, transistors 202, 204a, and 204b, and a current amplifier 208. Timing control module 220 is coupled to switch driver 116, a gate of transistor 204a, and a gate of transistor 204b. A source of transistor 204a is coupled to node 120, and a drain of transistor 204a is coupled to node B of current amplifier 208. A source of transistor 204b is coupled to node 118, and a drain of transistor 204b is coupled to node B of current amplifier 208. A source of transistor 202 is coupled to node 118, and a drain of transistor 202 is coupled to node A of current amplifier 208. A gate of transistor 202 is coupled to a ground potential.

Referring to FIG. 2, timing control module 220 and transistor 204b are configured to maintain a known voltage at node B of current amplifier 208 when P-type switch 102 is turned off. For example, the voltage at node B of current amplifier 208 may be substantially the same when P-type switch 102 is turned on and when P-type switch 102 is turned off. Timing control module 220 turns on transistor 204a and turns off transistor 204b when switch driver 116 turns off N-type switch 104 and turns on P-type switch 102. Timing control module 220 turns off transistor 204a and turns on transistor 204b before switch driver 116 turns off P-type switch 102 and turns on N-type switch 104.

In FIG. 2, current amplifier 208 is shown to include transistors 212, 214, and 216 and current sources 218a, b, and c, though the scope of the present invention is not limited in this respect. Current amplifier 208 may have any of a variety of circuit implementations, as will be recognized by persons skilled in the relevant art(s). Current amplifier 208 senses a voltage $V_B$ at node B and sets the voltage $V_A$ at node A to be substantially equal to $V_B$. For example, current amplifier 208 may set $V_A$ by driving node C appropriately.

Referring to FIG. 2, a source of transistor 212 is coupled to node A. A gate of transistor 212 is coupled to a drain of transistor 212 and to a gate of transistor 214. A source of transistor 214 is coupled to node B of current amplifier 208. A drain of transistor 214 is coupled to node C. Current source 218a is coupled between the drain of transistor 212 and a ground potential. Current source 218b is coupled between node C and the ground potential.

Node C is further coupled to a gate of transistor 216. A source of transistor 216 is coupled to node A, and a drain of transistor 216 is coupled to node D. Current source 218c is coupled between node D and the ground potential.

According to the embodiment of FIG. 2, current sources 218a-c are configured such that current $I_2$ is substantially equal to the sum of $I_1$ and $I_3$ (i.e., $I_2=I_1+I_3$). In this embodiment, the feedback loop formed by transistors 212, 214, and 216 may have relatively high bandwidth and/or give relatively fast response to current variation with relatively low power dissipation, as compared to conventional current sensing techniques.

Referring to FIG. 2, the drain-to-source resistance of P-type switch 102 is represented as $R_{ds1}$. Transistors 202 and 204a have drain-to-source resistances that are represented as $R_{ds2}$ and $R_{ds3}$, respectively. The voltage $V_A$ at node A may be represented as $$V_A=V_{in}-(I_1+I_3)*R_{ds2}. \quad \text{(Equation 1)}$$

The voltage $V_B$ at node B may be represented as $$V_B=V_{in}-dI*R_{ds1}-I_2*R_{ds3}. \quad \text{(Equation 2)}$$

In the embodiment of FIG. 2, the static voltage across transistor 202 is the same as the static voltage across transistor 204a when the sense current $I_{sense}$ equals zero. When current amplifier performs properly, voltages $V_A$ and $V_B$ are the same. Accordingly, $$V_A=V_B=V_{in}-dI*R_{ds1}-I_2*R_{ds3} \quad \text{(Equation 3)}$$

and the sense current $dI_{sense}$ may be represented as $$dI_{sense}=(V_{in}-V_A)/R_{ds2}-(I_1+I_3). \quad \text{(Equation 4)}$$

In the embodiment of FIG. 2, transistors 202 and 204a have the same device size (i.e., the same gate length L and gate width W), and $I_2=I_1+I_3$. Substituting Equation 3 into Equation 4 and incorporating the above-described relationships provides:

$$dI_{sense} = dI * \frac{R_{ds1}}{R_{ds2}}. \qquad \text{(Equation 5)}$$

Referring to FIG. 2, transimpedance amplifier 114 includes a variable resistor 226 and an amplifier 228. Amplifier 228 has an inverting node 222, a non-inverting node 224, and an output node 230. Variable resistor 226 is coupled between inverting node 222 and output node 230. Non-inverting node 224 is coupled to a common mode potential. Current sensing module 112 provides the sense current $dI_{sense}$ at inverting node 222. Sense current $dI_{sense}$ flows through variable resistor 226, thereby setting the sense voltage $V_{sense\_out}$. Using Equation 5 for $dI_{sense}$, the sense voltage $V_{sense\_out}$ may be represented as:

$$V_{sense\_out} = dI_{sense} * R_{fb} = dI * \frac{R_{ds1}}{R_{ds2}} * R_{fb}. \qquad \text{(Equation 6)}$$

Variable resistor 114 may be a poly resistor, though the scope of the present invention is not limited in this respect. As shown in Equation 6, the sense voltage $V_{sense\_out}$ is proportional to the ratio between the drain-to-source resistance $R_{ds1}$ of P-type switch 102 and the drain-to-source resistance $R_{ds2}$ of transistor 202.

In FIG. 2, transistors 202, 204a-b, 212, 214, and 216 are shown as field effect transistors (FETs) for illustrative purposes. However, the scope of the present invention is not limited in this respect. Persons skilled in the relevant arts will recognize that transistors 202, 204a-b, 212, 214, and 216 may be of any type, including but not limited to high electron mobility transistor (HEMT), bipolar junction transistor (BJT), etc.

Figure 3:
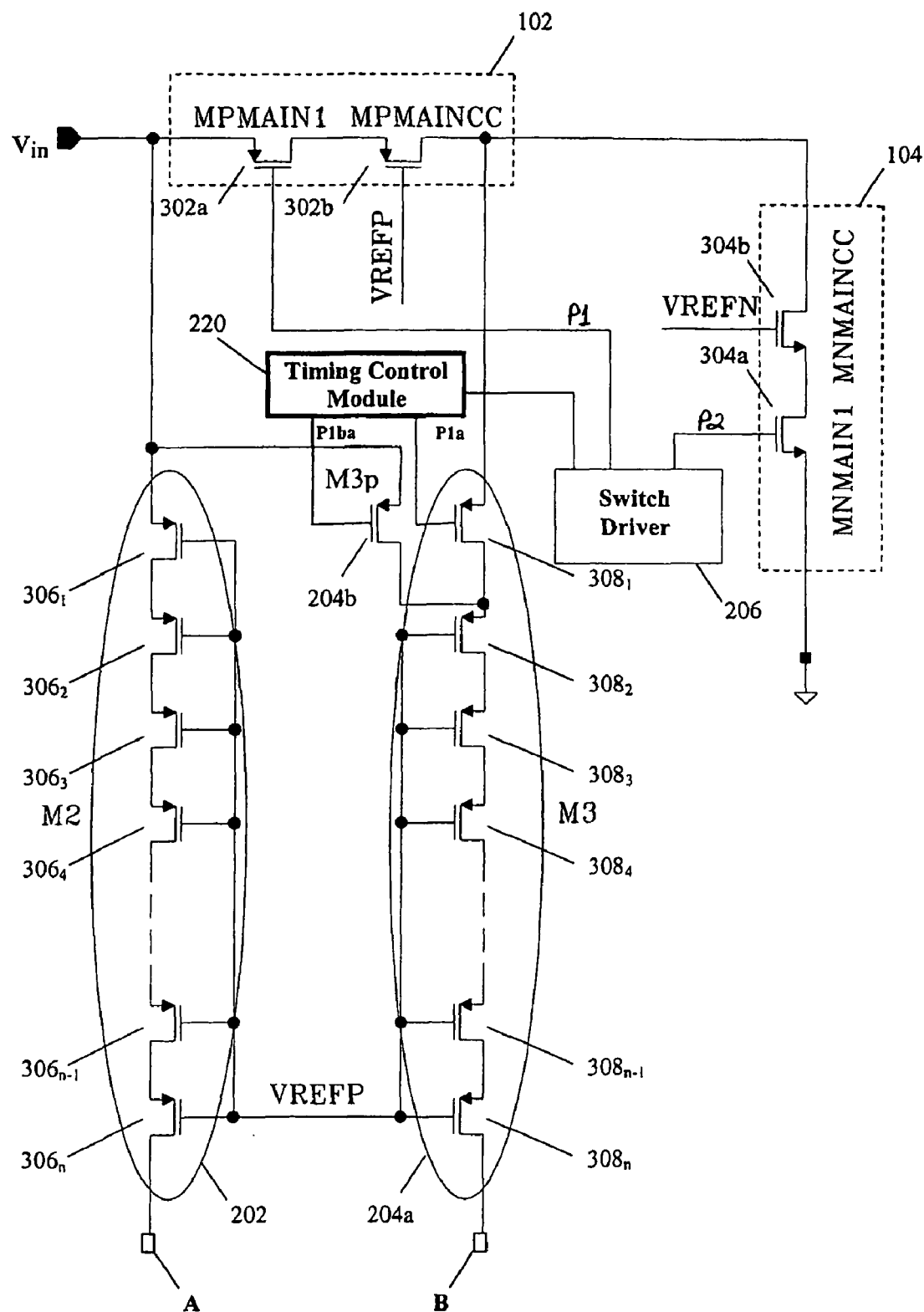
FIG. 3 shows a portion of the switch regulator module of FIG. 2, according to an example embodiment of the present invention.
Figure 3A:
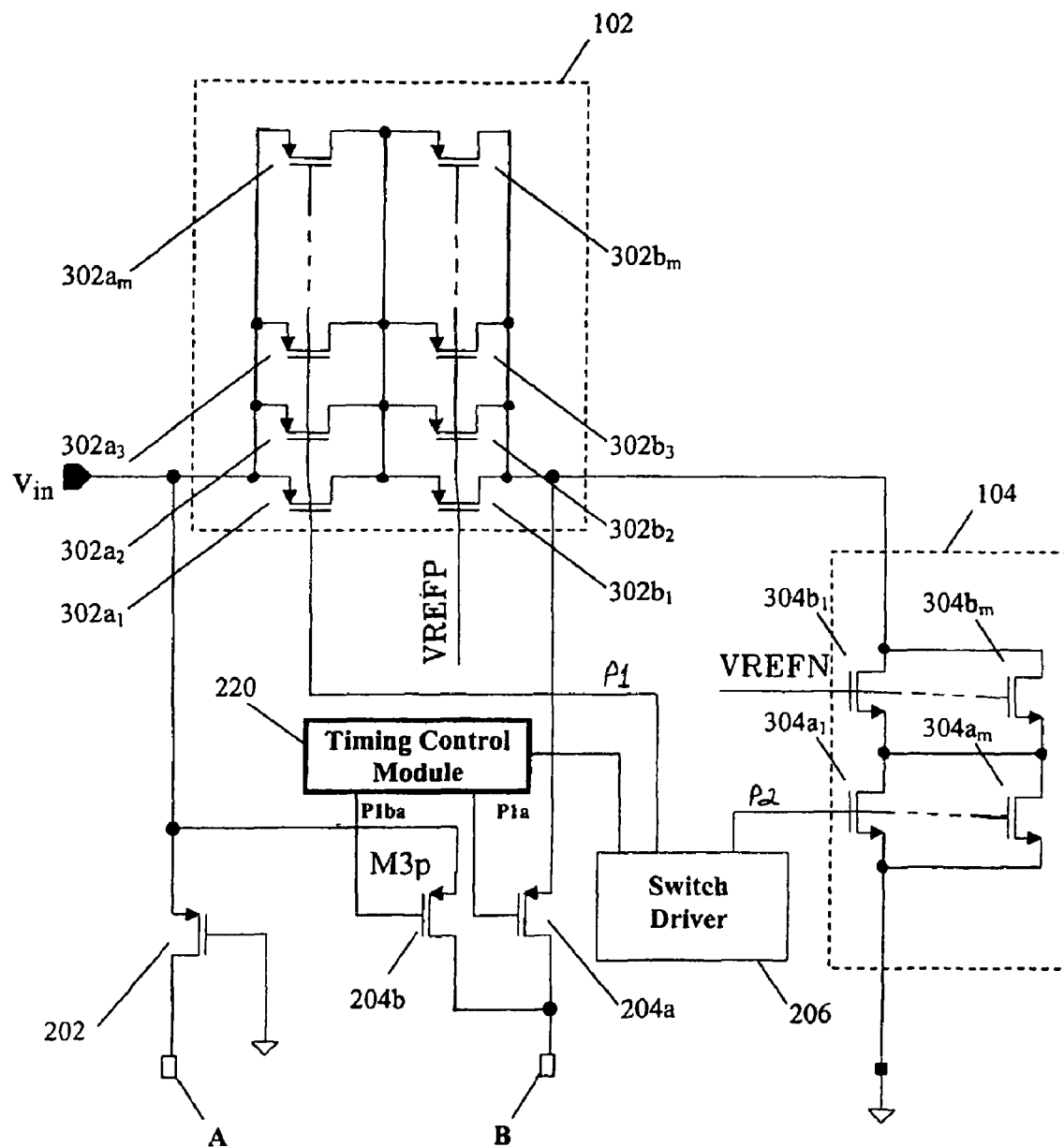
FIG. 3A shows a portion of the switch regulator module of FIG. 2, according to another example embodiment of the present invention.

Referring now to FIGS. 3 and 3A, one or more switches and/or transistors of switch regulator module 100 may include a plurality of transistors. The plurality of transistors may be coupled in parallel, series, cascade, cascode, or any combination thereof, to provide some examples. Transistors that are coupled in parallel have a lower on-resistance, as compared to a single transistor. Transistors that are coupled in series have a higher on-resistance and a greater operating range, as compared to a single transistor. Transistors that are cascade-coupled have a higher voltage tolerance, as compared to a single transistor.

In FIG. 3, switches 102 and 104 are each shown to be a plurality of cascode-coupled transistors for illustrative purposes. Switch 102 includes transistors 302a and 302b, each of which may have a rated voltage beyond which its performance diminishes. Cascode-coupling transistors 302a and 302b may enable the combination of transistors 302a and 302b to be used at voltages beyond the rated voltage of transistor 302a or 302b alone. Switch 104 includes transistors 304a and 304b, the cascode-coupled combination of which may be capable of proper operation at voltages beyond the rated voltage of transistor 304a or 304b alone.

Transistors 202 and 204a are each shown to be a plurality of series-connected transistors for illustrative purposes. Transistor 202 includes transistors $306_1$ through $306_n$. Transistor 204a includes transistors $308_1$ through $308_n$. In the embodiment of FIG. 3, transistors $306_1$-$306_n$ and $308_1$-$308_n$ are each based on a unit element, which is defined as an element having a unit gate length L and a unit gate width W. Transistors $306_1$-$306_n$ and $308_1$-$308_n$ can each include any number of unit elements in any of a variety of configurations.

In FIG. 3, the unit element is based on the size of P-type switch 102. For example, each of transistors $306_1$-$306_n$ and $308_1$-$308_n$ may be the same size as P-type switch 102, meaning that each of transistors $306_1$-$306_n$ and $308_1$-$308_n$ includes the same number of unit elements as P-type switch 102 in the same configuration as P-type switch 102. In another example, one or more of transistors $306_1$-$306_n$ and $308_1$-$308_n$ may include a number of unit elements that is different from the number of unit elements included in P-type switch 102. In yet another example, one or more of transistors $306_1$-$306_n$ and $308_1$-$308_n$ may include unit elements having a configuration that is different from the configuration of the unit elements in P-type switch 102. As suggested above, each of transistors $306_1$-$306_n$ or $308_1$-$308_n$ need not necessarily have the same configuration. Transistor 202 is configured to have enough series-connected transistors 306 to provide sufficient dynamic range for current sensing module 112.

In FIG. 3A, transistors 302a, 302b, 304a, and 304b are each shown to be a plurality of parallel-coupled transistors for illustrative purposes. Transistors 302a and 302b include transistors $302a_1$ through $302a_m$ and $302b_1$ through $302b_m$, respectively. Transistors 304a and 304b include transistors $304a_1$ through $304a_m$ and $304b_1$ through $304b_m$, respectively. In the embodiment of FIG. 3A, transistors $302a_1$-$302a_m$, $302b_1$-$302b_m$, $304a_1$-$304a_m$, and $304b_1$-$304b_m$ are each based on the same unit element. Transistors $302a_1$-$302a_m$, $302b_1$-$302b_m$, $304a_1$-$304a_m$, and $304b_1$-$304b_m$ can each include any number of unit elements in any of a variety of configurations.

According to some embodiments, basing transistors and/or switches on the same unit element may enable process and/or temperature variation between the transistors and/or switches to be cancelled in the first order. For example, process and/or temperature variation between P-type switch 102 and transistor 202 may be cancelled in the first order by basing P-type switch 102 and transistor 202 on the same unit element. Referring to FIGS. 3 and 3A, the unit element on which transistors $302a_1$-$302a_m$, $302b_1$-$302b_m$, $304a_1$-$304a_m$, and $304b_1$-$304b_m$ are based may be the same as the unit element on which transistors $306_1$-$306_n$ and $308_1$-$308_n$ are based. It should be noted that the examples described herein are provided for illustrative purposes and are not intended to limit the scope of the present invention.

Figure 4:
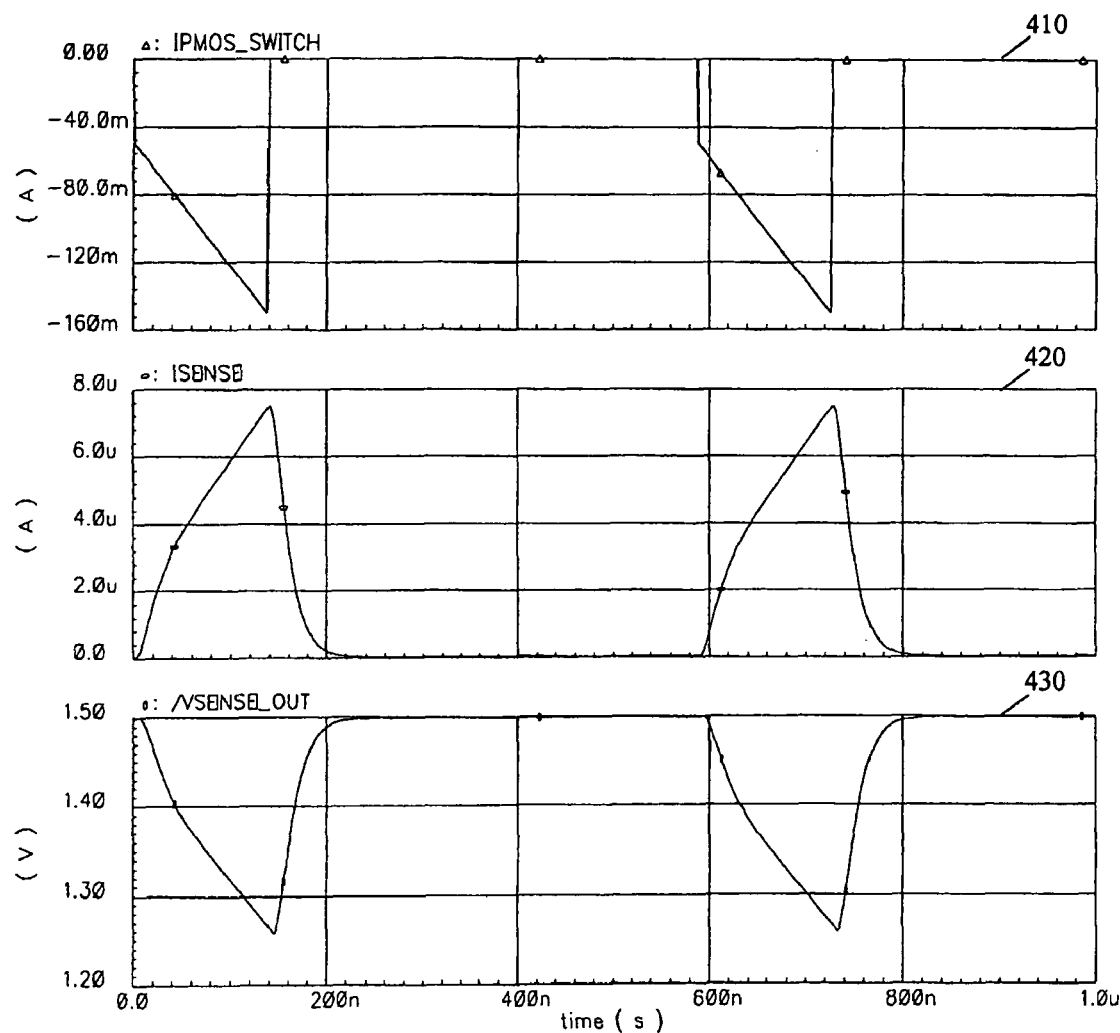
FIG. 4 shows example waveforms associated with the switch regulator module of FIG. 2, according to an embodiment of the present invention.

FIG. 4 shows example waveforms associated with the switch regulator module 100 of FIG. 2, according to an embodiment of the present invention.

Waveform 410 shows the current dI that flows through P-type switch 102 and impedance 106. Waveform 420 shows the sense current $dI_{sense}$, as determined by current sensing module 112. Waveform 430 shows the sense voltage $V_{sense\_out}$, which is provided at node 230 of switch regulator module 100.

Referring to FIG. 4, a trigger event occurs at approximately 140 ns along the time axis, causing the current dI that flows through impedance 106 and the sense current $dI_{sense}$ to return to approximately zero amps, as shown in respective waveforms 410 and 420. As shown in waveform 430, the trigger event further causes the sense voltage $V_{sense\_out}$ to return to a substantially constant magnitude. The trigger event need not occur at the time shown in FIG. 4 and may occur at any time.

The trigger event can be based on any of a variety of factors, including but not limited to load current, desired output voltage, and/or input voltage. For example, the trigger event may occur when $dI_{sense}$ reaches a threshold. In FIG. 4, the trigger event is shown to occur when $dI_{sense}$ is approximately 7.6 µA. In this example, the trigger event may be set to occur when $dI_{sense}$ reaches 7.6 µA. In another example, the trigger event may occur when $V_{sense\_out}$ reaches a threshold.

In FIG. 4, the trigger event is shown to occur when $V_{sense\_out}$ is approximately 1.26 V. In this example, the trigger event may be set to occur when $V_{sense\_out}$ reaches 1.26 V. The values for $dI_{sense}$ and $V_{sense\_out}$ in FIG. 4 are provided for illustrative purposes and are not intended to limit the scope of the present invention.

Figure 5:
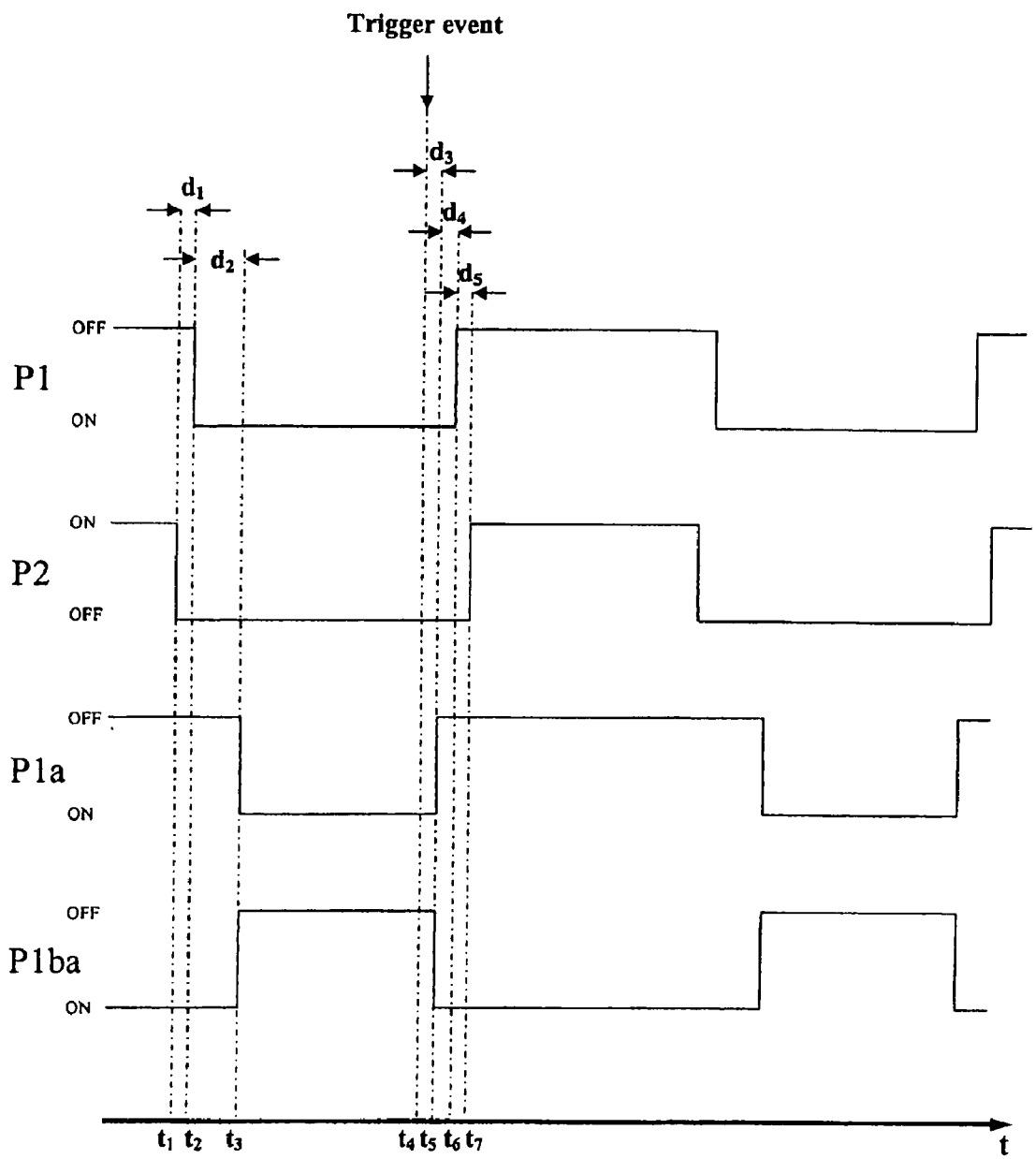
FIG. 5 is a timing diagram according to an embodiment of the present invention.

FIG. 5 is a timing diagram according to an embodiment of the present invention. In FIG. 5 and with reference to switch regulator module 100 of FIG. 1, P1 and P2 represent the signals that switch driver 116 uses to control the respective gates of P-type switch 102 and N-type switch 104. P1a and P1ba represent the signals that timing control module 220 uses to control the respective gates of transistor 204a and transistor 204b.

As shown in FIG. 5, P1 and P1a are initially "high", indicating that P-type switch 102 and transistor 204a, respectively, are turned off. P2 is initially high, indicating that N-type switch 104 is turned on. P1ba is initially "low", indicating that transistor 204b is turned on. At time $t_1$, switch driver 116 sets P2 at a low state, thereby turning off N-type switch 104. At time $t_2$, switch driver 116 sets P1 at a low state, thereby turning on P-type switch 102. At time $t_3$, timing control module 220 sets P1a at a low state and sets P1ba at a high state, thereby turning on transistor 204a and turning off transistor 204b.

A trigger event occurs at time $t_4$. At time $t_5$, in response to the trigger event, timing control module 220 sets P1a at a high state and sets P1ba at a low state, thereby turning off transistor 204a and turning on transistor 204b. At time $t_6$, switch driver 116 sets P1 at a high state, thereby turning off P-type switch 102. At time $t_7$, switch driver 116 sets P2 at a high state, thereby turning on N-type switch 104.

Referring to FIG. 5, $d_1$ through $d_5$ represent delays, the respective durations of which may be represented as $d_1=t_2-t_1$, $d_2=t_3-t_2$, $d_3=t_5-t_4$, $d_4=t_6-t_5$, and $d_5=t_7-t_6$. Delay $d_1$ is implemented to allow N-type switch 104 to turn off sufficiently before P-type switch 102 is turned on at $t_2$. Delay $d_2$ is implemented to allow a transient voltage glitch associated with P-type switch 102 to settle (e.g., stop ringing) before transistors 204a-b are toggled at $t_3$. Delay $d_3$ is the time period between the occurrence of the trigger event at $t_4$ and the toggling of transistors 204a-b at $t_5$. Delay $d_4$ is implemented to allow transistors 204a-b to sufficiently change respective states before P-type transistor 102 is turned off at $t_6$. Delay $d_5$ is implemented to allow P-type switch 102 to turn off sufficiently before N-type switch 104 is turned on at $t_7$.

Figure 6:
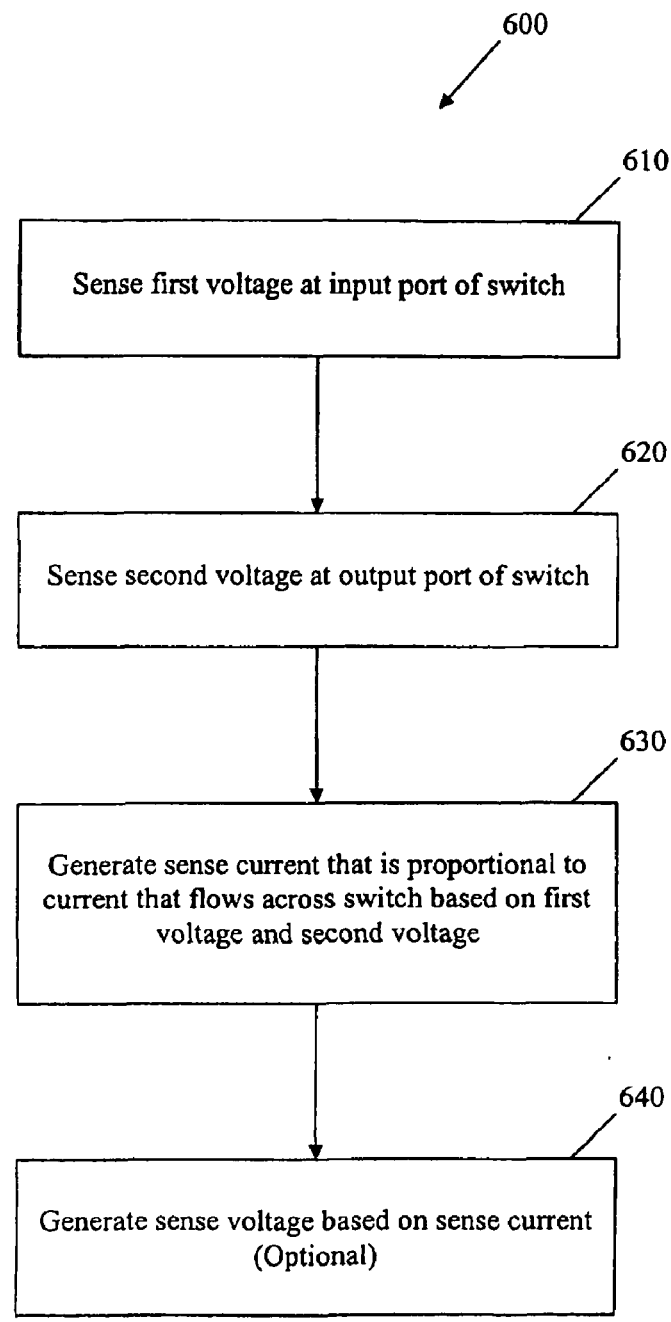
FIG. 6 is a flowchart of a method of sensing a current according to an embodiment of the present invention.

FIG. 6 illustrates a flowchart 600 of a method of sensing a current that flows through a switch in accordance with an embodiment of the present invention. The invention, however, is not limited to the description provided by the flowchart 600. Rather, it will be apparent to persons skilled in the relevant art(s) from the teachings provided herein that other functional flows are within the scope and spirit of the present invention.

Flowchart 600 will be described with continued reference to switch regulator module 100 described above in reference to FIG. 2, though the method is not limited to that embodiment.

Referring now to FIG. 6, a first voltage is sensed at an input port of a switch at block 610. For example, transistor 202 may sense the first voltage at node 118 of switch regulator module 100. A second voltage is sensed at an output port of the switch at block 620. For instance, transistor 204a may sense the second voltage at node 120 of switch regulator module 100. At block 630, a sense current that is proportional to the current that flows through the switch is generated based on the first voltage and the second voltage. For example, current amplifier 208 may generate the sense current that is proportional to the current that flows through switch 102 based on the first voltage and the second voltage. As shown a block 640, a sense voltage optionally is generated based on the sense current. For instance, transimpedance amplifier 114 may generate the sense voltage.

Referring back to block 630 of FIG. 6, a sense current is shown to be generated for illustrative purposes. However, the invention is not limited in this respect. It will be apparent to persons skilled in the relevant art(s) that any signal that is proportional to the current that flows through the switch may be generated. For example, the signal may be a voltage.

The current sensing techniques described herein may provide lower power dissipation and/or higher efficiency, as compared to conventional current sensing techniques. These current sensing techniques may be relatively easy to implement and may provide relatively fast sensing of the current that flows through P-type switch 102. Transistors 202 and 204a may be configured to substantially reduce or cancel process and/or temperature variations associated with P-type switch 102. Embodiments of the present invention may be capable of tolerating a relatively high input voltage range without using high voltage tolerant devices. Switch regulator module 100 may be easily scaled with higher switching frequency by adjusting the current of current amplifier 208. Embodiments of the present invention may be incorporated into any of a variety of applications, including but not limited to over-current protection and/or current programming. For instance, switch regulator module 100 may be configured to switch to relatively bigger devices if the sense current $dI_{sense}$ exceeds a threshold.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above described exemplary embodiments, but should be defined only in accordance with the following claims and their equivalents.

What is claimed is:

1. An apparatus for sensing current in a circuit comprising:
a first switch having an input port and an output port;
a current sensing module coupled to the input port and the output port of the first switch to sense respective voltages at the input port and the output port, and configured to provide a sense signal that is proportional to a current that flows through the first switch, based on the sensed voltages;
a second switch coupled between the output port of the first switch and a ground potential; and
a switch driver coupled to respective control nodes of the first and second switches, and configured to alternately open and close the first and second switches using the control nodes.

2. The apparatus of claim 1, wherein the first switch includes a plurality of cascode-coupled switches.

3. The apparatus of claim 2, wherein the second switch include a plurality of cascode-coupled switches.

4. The apparatus of claim 1, wherein the sense signal is a sense voltage.

5. The apparatus of claim 1, wherein the sense signal is a sense current.

6. The apparatus of claim 5, further comprising a transimpedance amplifier to provide a sense voltage based on the sense current.

7. The apparatus of claim 6, wherein the current sensing module is configured to provide the sense signal at a first node, and wherein the transimpedance amplifier includes
an amplifier having an inverting node, a non-inverting node, and an output node, wherein the inverting node is coupled to the first node of the current sensing module, and wherein the non-inverting node is coupled to a reference node; and
a resistor coupled between the inverting node and the output node.

8. An apparatus for sensing current in a circuit comprising:
a first switch having an input port and an output port;
a current sensing module coupled to the input port and the output port of the first switch to sense respective voltages at the input port and the output port, and configured to provide a sense signal that is proportional to a current that flows through the first switch, based on the sensed voltages;
a second switch coupled between the output port of the first switch and a ground potential;
an inductor coupled between the output port of the first switch and an output node; and
a capacitor coupled between the output node and the ground potential.

9. An apparatus for sensing current in a circuit comprising:
a first switch having an input port and an output port;
a current sensing module coupled to the input port and the output port of the first switch to sense respective voltages at the input port and the output port, and configured to provide a sense signal that is proportional to a current that flows through the first switch, based on the sensed voltages;
a second switch coupled between the output port of the first switch and a ground potential;
wherein the current sensing module includes:
a current amplifier having first, second, and third nodes;
wherein the first node of the current amplifier is coupled to the input port of the first switch and the second node of the current amplifier is coupled to the output port of the first switch; and
wherein the current amplifier provides the sense signal at the third node.

10. The apparatus of claim 9, wherein the current amplifier includes:
a first transistor and a first current source coupled in series between the first node and a reference node;
a second transistor coupled between the second node and a fourth node of the current amplifier;
a second current source coupled between the fourth node and the reference node;
a third transistor coupled between the first node and the third node; and
a third current source coupled between the third node and the reference node;
wherein a control node of the third transistor is coupled to the fourth node.

11. The apparatus of claim 9, wherein the current sensing module further includes:
a first transistor coupled between the input port of the first switch and the first node of the current amplifier; and
a second transistor coupled between the output port of the first switch and the second node of the current amplifier.

12. The apparatus of claim 11, wherein the first transistor includes a first plurality of series-connected transistors, and wherein the second transistor includes a second plurality of series-connected transistors.

13. The apparatus of claim 11, wherein the current sensing module further includes:
a third transistor coupled between the input port of the first switch and the second node of the current amplifier; and
a timing control module coupled to respective control nodes of the second transistor and the third transistor.

14. The apparatus of claim 9, wherein the current amplifier includes:
a first transistor and a first current source coupled in series between the first node and a reference node;
a second transistor coupled between the second node and a fourth node of the current amplifier;
a second current source coupled between the fourth node and the reference node;
a third transistor coupled between the first node and the third node; and
a third current source coupled between the third node and the reference node;
wherein a control node of the third transistor is coupled to the fourth node.

15. The apparatus of claim 14, wherein current amplifier is configured to equalize the voltages between the fourth node and a fifth node that is defined between the first transistor and the first current source.

16. An apparatus for sensing current in a circuit comprising:
a first switch having an input port and an output port; and
a current sensing module coupled to the input port and the output port of the first switch to sense respective voltages at the input port and the output port, and configured to provide a sense signal that is proportional to a current that flows through the first switch, based on the sensed voltages;
wherein the current sense module includes a current amplifier having first, second, and third nodes, wherein the first node of the current amplifier is coupled to the input port of the first switch and the second node of the current amplifier is coupled to the output port of the first switch; and
wherein the current amplifier provides the sense signal at the third node.

17. The apparatus of claim 16, wherein the sense signal is a sense current, and the apparatus further comprising a transimpedance amplifier to provide a sense voltage based on the sense current.

18. The apparatus of claim 17, wherein the transimpedance amplifier includes
an amplifier having an inverting node, a non-inverting node, and an output node, wherein the inverting node is coupled to the third node of the current amplifier, and wherein the non-inverting node is coupled to a reference node.

* * * * *